United States Patent
Zhang et al.

(10) Patent No.: US 12,265,127 B2
(45) Date of Patent: Apr. 1, 2025

(54) METHOD OF DETECTING AND POSITIONING INSULATION FAILURE OF AIRCRAFT GENERATOR

(71) Applicant: University of Nottingham Ningbo China, Zhejiang (CN)

(72) Inventors: He Zhang, Zhejiang (CN); Xiaochen Zhang, Zhejiang (CN); Jing Li, Zhejiang (CN); Xiaoyan Huang, Zhejiang (CN); Yuanli Kang, Zhejiang (CN); Yixiang Yuan, Zhejiang (CN)

(73) Assignee: University of Nottingham Ningbo China, Ningbo (CN)

( * ) Notice: Subject to any disclaimer, the term of this patent is extended or adjusted under 35 U.S.C. 154(b) by 130 days.

(21) Appl. No.: 18/202,957

(22) Filed: May 29, 2023

(65) Prior Publication Data
US 2024/0353493 A1   Oct. 24, 2024

(30) Foreign Application Priority Data

Apr. 20, 2023   (CN) .......................... 202310425327.2

(51) Int. Cl.
| | |
|---|---|
| G01R 31/34 | (2020.01) |
| G01R 31/14 | (2006.01) |
| H02K 11/20 | (2016.01) |
| B64D 45/00 | (2006.01) |

(52) U.S. Cl.
CPC ........... *G01R 31/346* (2013.01); *G01R 31/14* (2013.01); *H02K 11/20* (2016.01); *B64D 2045/0085* (2013.01); *H02K 2211/00* (2013.01)

(58) Field of Classification Search
None
See application file for complete search history.

(56) References Cited

U.S. PATENT DOCUMENTS

| | | | | |
|---|---|---|---|---|
| 6,972,554 | B1* | 12/2005 | Davis | G01R 31/343 324/121 R |
| 11,073,561 | B2* | 7/2021 | Hayashi | G01R 31/52 |
| 2015/0309106 | A1* | 10/2015 | Machida | G01R 27/18 324/509 |

* cited by examiner

*Primary Examiner* — Jermele M Hollington

(57) ABSTRACT

A method of detecting and positioning an insulation failure of an aircraft generator is provided, comprising: S1, for each stator slot in the aircraft generator, wrapping one semiconductor layer on a surface of an external insulation layer of each copper conductor in the stator slot; S2, for each semiconductor layer, partitioning the semiconductor layer to obtain a plurality of zones, disposing a resistor-inductance branch network in each zone, and connecting the resistor-inductance branch networks to form an insulation failure detection circuit; S3, supplying power to a three-phase winding of the aircraft generator from an external power source; S4, determining whether an unearthed voltage is present in four end corners of the insulation failure detection circuit; if not, returning to S3 for further powering; if yes, outputting a detection result and collecting an insulation failure position with potential change and difference in the insulation failure detection circuit as a positioning result.

7 Claims, 4 Drawing Sheets

METHOD OF DETECTING AND POSITIONING INSULATION FAILURE OF AIRCRAFT GENERATOR

This application is based upon and claims priority to Chinese Patent Application No. 202310425327.2, filed on Apr. 20, 2023, the entire contents of which are incorporated herein by reference.

TECHNICAL FIELD

The present disclosure relates to the technical field of generator failure detection and positioning, and in particular to a method of detecting and positioning an insulation failure of an aircraft generator.

BACKGROUND

Stators of aircraft generators usually comprise a plurality of windings. The insulation failure of the windings is one of major causes to fail the stators. After occurrence of insulation failure of a winding, a turn-to-turn short-circuiting is most likely to occur, thus leading to various failures.

In order to detect the insulation failure of the windings, one of the solutions is to wrap one layer of semiconductor around an insulation layer of the cables. In this case, when the generator works normally, there is no potential difference present in the semiconductor layer and hence no voltage is generated. But, when an insulation failure occurs to a winding, the insulation layer will be broken down. As a result, a conductor in the cable is connected to the semiconductor layer, such that a potential difference and a voltage are generated in the semiconductor layer. Therefore, whether an insulation failure occurs to a winding can be determined by detecting whether there is a voltage or potential difference.

However, the above detection method of a winding insulation failure can only detect whether an insulation failure occurs to a winding. Since there are a plurality of windings in a stator, it is impossible to, by detecting a voltage or potential difference, determine a winding subjected to an insulation failure and a specific position of occurrence of the insulation failure in the insulation layer, leading to replacement of the entire insulation layer and increase of the repair costs.

SUMMARY

In order to address the above technical problems, the present disclosure provides a method of detecting and positioning an insulation failure of an aircraft generator to accurately determine a winding subjected to an insulation failure and a specific position of occurrence of the insulation failure in an insulation layer, without needing to replace the entire insulation layer, thus greatly reducing the repair costs.

In order to solve the above problems, the present disclosure provides a method of detecting and positioning an insulation failure of an aircraft generator, comprising:
  at step S1, for each stator slot in the aircraft generator, wrapping one semiconductor layer on a surface of an external insulation layer of each copper conductor in the stator slot;
  at step S2, for each semiconductor layer, partitioning the semiconductor layer to obtain a plurality of zones, disposing a resistor-inductance branch network in each zone, and connecting the resistor-inductance branch networks to form an insulation failure detection circuit;
  at step S3, supplying power to a three-phase winding of the aircraft generator from an external power source;
  at step S4, determining whether an unearthed voltage is present in four end corners of the insulation failure detection circuit;
  if not, returning to perform the step S3 of supplying power to the three-phase winding;
  if yes, outputting a detection result indicating an insulation failure and collecting an insulation failure position with potential change and a potential difference in the insulation failure detection circuit as a positioning result for outputting.

In this solution, after the semiconductor layer is wrapped, the insulation failure detection circuit is arranged on the semiconductor layer. When the aircraft generator works normally, if no insulation failure occurs to the insulation layer, the insulation failure detection circuit has no input voltage. When an insulation failure occurs to the insulation layer of any winding, an input voltage of a power supply circuit will surge into the insulation failure detection circuit, and the insulation failure detection circuit obtains an accurate position of the insulation failure based on the input voltage, so as to provide position guide for subsequent repair. In this way, only partial insulation layer needs to be replaced during repair without replacing the whole insulation layer, greatly reducing the repair costs.

Preferably, in step S1, the semiconductor layer unfolded to form a square shape is wrapped on the surface of the insulation layer, and a gap is reserved as a voltage monitoring point on the semiconductor layer to monitor the voltage.

In this solution, detection on whether an insulation failure occurs may also be implemented by using the voltage monitoring point on the semiconductor layer. If an earthed voltage is present at the voltage monitoring point, it indicates an insulation failure occurs, and otherwise, no insulation failure occurs. In this way, the accuracy of the insulation failure can be further verified.

Preferably, before the step S4 is performed, the method further comprises:
  determining whether a voltage is present at the voltage monitoring point;
  if yes, outputting the detection result indicating presence of the insulation failure and performing the step S4;
  if not, returning to perform the step S3 of supplying power to the three-phase winding.

In this solution, the determination of the voltage monitoring point for the voltage is taken as an advance determination of the step S4. When a voltage is present at the voltage monitoring point, the insulation failure is positioned in step S4. When no voltage is present at the voltage monitoring point, it indicates no input voltage is in the insulation failure detection circuit. Thus, the operation of continuing power supply is directly performed so as to save the step flow and increase the analysis rate.

Preferably, in step S2, the semiconductor layer is partitioned into a plurality of zones and semiconductor electric parameters of each zone are equivalently set to inductances and resistors. Based on position of each zone, the inductances and resistors equivalently set are connected head to tail sequentially, so as to form the resistor-inductance branch network corresponding to the semiconductor layer.

Preferably, the insulation failure detection circuit comprises:
  a first resistor, where one end of the first resistor is earthed;

a first inductance, where one end of the first inductance is connected to the other end of the first resistor;

a second resistor, where one end of the second resistor is connected to the other end of the first inductance;

a second inductance, where one end of the second inductance is connected to the other end of the second resistor;

a third inductance, where one end of the third inductance is connected to one end of the first resistor;

a third resistor, where one end of the third resistor is connected to the other end of the third inductance;

a fourth inductance, where one end of the fourth inductance is respectively connected to the other end of the first inductance and one end of the second resistor;

a fourth resistor, where one end of the fourth resistor is connected to the other end of the fourth inductance;

a fifth inductance, where one end of the fifth inductance is connected to the other end of the second inductance;

a fifth resistor, where one end of the fifth resistor is connected to the other end of the fifth inductance;

a sixth resistor, where one end of the sixth resistor is connected to the other end of the third resistor;

a sixth inductance, where one end of the sixth inductance is connected to the other end of the sixth resistor, and the other end of the sixth inductance is connected to the other end of the fourth resistor;

a seventh resistor, where one end of the seventh resistor is respectively connected to the other end of the sixth inductance and the other end of the fourth resistor;

a seventh inductance, where one end of the seventh inductance is connected to the other end of the seventh resistor, and the other end of the seventh inductance is connected to the other end of the fifth resistor;

an eighth inductance, where one end of the eighth inductance is respectively connected to the other end of the third resistor and one end of the sixth resistor;

an eighth resistor, where one end of the eighth resistor is connected to the other end of the eighth inductance and the other end of the eighth resistor is earthed;

a ninth inductance, where one end of the ninth inductance is respectively connected to the other end of the sixth inductance and one end of the seventh resistor;

a ninth resistor, where one end of the ninth resistor is connected to the other end of the ninth inductance;

a tenth inductance, where one end of the tenth inductance is respectively connected to the other end of the seventh inductance and the other end of the fifth resistor;

a tenth resistor, where one end of the tenth resistor is connected to the other end of the tenth inductance;

an eleventh resistor, where one end of the eleventh resistor is connected to the other end of the eighth resistor;

an eleventh inductance, where one end of the eleventh inductance is connected to the other end of the eleventh resistor and the other end of the eleventh inductance is connected to the other end of the ninth resistor;

a twelfth resistor, where one end of the twelfth resistor is respectively connected to the other end of the eleventh inductance and the other end of the ninth resistor;

a twelfth inductance, where one end of the twelfth inductance is connected to the other end of the twelfth resistor and the other end of the twelfth inductance is connected to the other end of the tenth resistor.

Preferably, the power supply circuit comprises:

a H bridge control unit, where an input end of the H bridge control unit is connected to an external power source;

a thirteenth resistor, where one end of the thirteenth resistor is connected to an output end of the H bridge control unit;

a thirteenth inductance, where one end of the thirteenth inductance is connected to the other end of the thirteenth resistor and the other end of the thirteenth inductance is connected to a first winding of the aircraft generator;

a fourteenth resistor, where one end of the fourteenth resistor is connected to the output end of the H bridge control unit;

a fourteenth inductance, where one end of the fourteenth inductance is connected to the other end of the fourteenth resistor, and the other end of the fourteenth inductance is connected to a second winding of the aircraft generator;

a fifteenth resistor, where one end of the fifteenth resistor is connected to the output end of the H bridge control unit;

a fifteenth inductance, where one end of the fifteenth inductance is connected to the other end of the fifteenth resistor, and the other end of the fifteenth inductance is connected to a third winding of the aircraft generator.

Preferably, in step S4, point voltages at four opposite angles of equi-potential lines of the fault point are respectively detected. Corresponding voltage drop ratios obtained by processing four point voltages in pairs, and then each voltage drop ratio is compared with a preset fault point ratio table to obtain the corresponding insulation failure position.

In this solution, considering, for each insulation failure position, three voltage drop ratios calculated based on the point voltages of four opposite angles of the equi-potential lines of the fault point are unique and different, the specific insulation failure position can be accurately obtained by simply comparing the voltage drop ratios and the fault point ratios.

Figure 1:
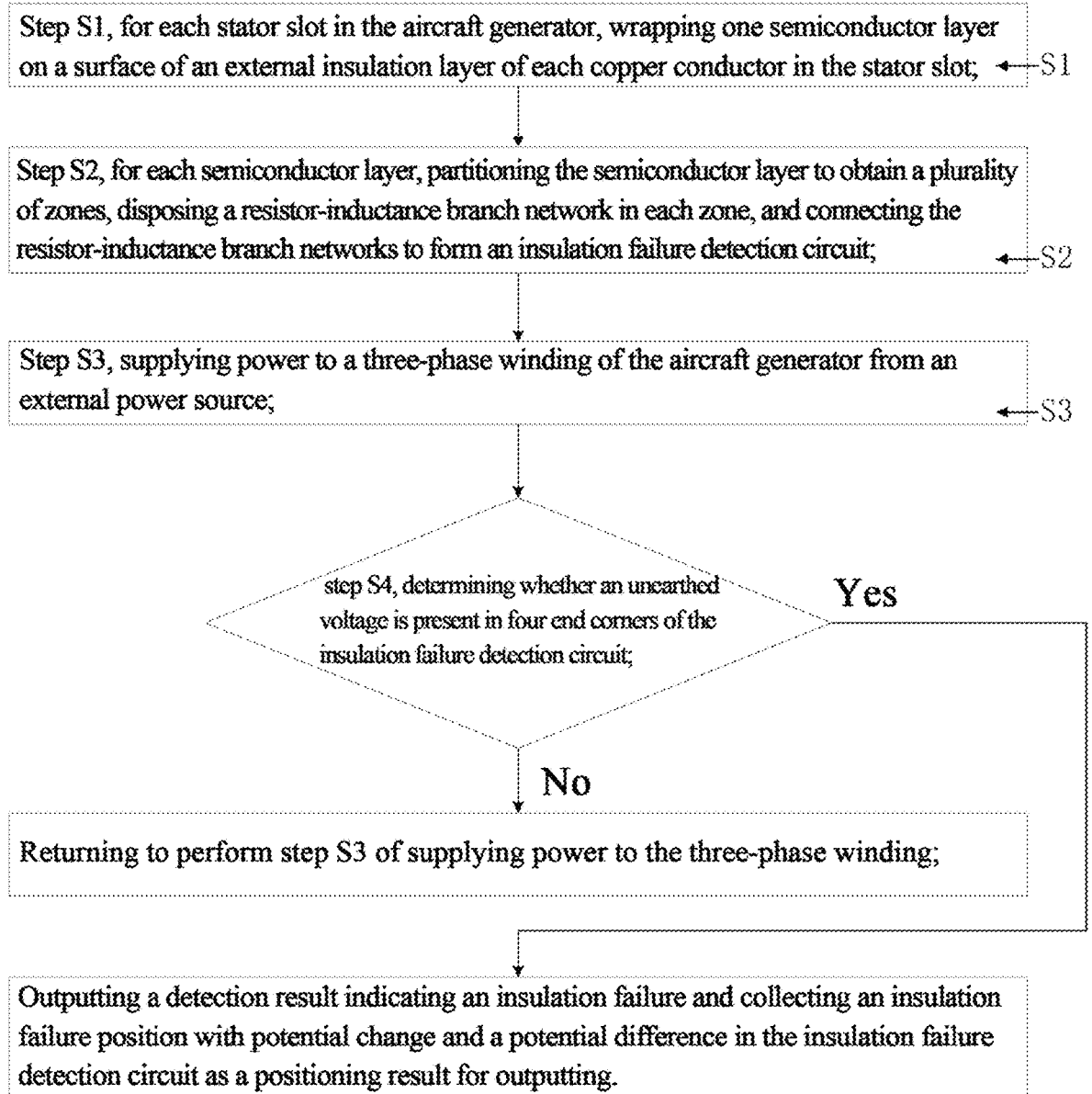
FIG. 1 is a flowchart illustrating steps of the present disclosure.

Numerals of the drawings are described below: 1. stator slot, 2. copper conductor, 3. insulation layer, 4. semiconductor layer, 5. H bridge control unit.

Embodiments

In order to make the above objects, features and advantages of the present disclosure clearer and more intelligible, the specific embodiments of the present disclosure will be detailed below in combination with the drawings.

In a preferred embodiment of the present disclosure, based on the existing problems in the prior arts, there is provided a method of detecting and positioning an insulation failure of an aircraft generator. As shown in FIGS. 1 to 4, the method includes the following steps.

At step S1, for each stator slot 1 in the aircraft generator, one semiconductor layer 4 is wrapped on a surface of an external insulation layer 3 of each copper conductor 2 in the stator slot 1.

At step S2, for each semiconductor layer 4, the semiconductor layer 4 is partitioned to obtain a plurality of zones, a resistor-inductance branch network is disposed in each zone, and the resistor-inductance branch networks are connected to form an insulation failure detection circuit.

At step S3, power is supplied to a three-phase winding of the aircraft generator from an external power source.

At step S4, whether an unearthed voltage is present in four end corners of the insulation failure detection circuit is determined;
  if the unearthed voltage is present is not present, the step S3 of supplying power to the three-phase winding is continued;
  if the unearthed voltage is present is present, a detection result indicating an insulation failure is output and an insulation failure position with potential change and a potential difference in the insulation failure detection circuit are collected as a positioning result for outputting.

Specifically, in the present embodiment, after the semiconductor layer 4 is wrapped, the insulation failure detection circuit is arranged on the semiconductor layer 4. When the aircraft generator works normally, if no insulation failure occurs to the insulation layer 3, the insulation failure detection circuit has no input voltage. When an insulation failure occurs to the insulation layer 3 of any winding, an input voltage of a power supply circuit will surge into the insulation failure detection circuit, and the insulation failure detection circuit obtains an accurate position of the insulation failure based on the input voltage, so as to provide position guide for subsequent repair. In this way, only partial insulation layer 3 needs to be replaced during repair without replacing the whole insulation layer 3, greatly reducing the repair costs.

Preferably, the insulation failure detection circuit covers the whole semiconductor layer 4 and the semiconductor layer 4 covers the whole insulation layer 3. In this case, when an insulation failure occurs to any position of the insulation layer 3, the input voltage of the power supply circuit can be used for the semiconductor layer 4 so as to achieve full-coverage detection for an insulation failure position on the insulation layer 3.

Preferably, the semiconductor layer 4 may be a thin foil rolled around the insulation layer 3.

In a preferred embodiment of the present disclosure, in step S1, the semiconductor layer 4 unfolded to form a square shape is wrapped on the surface of the insulation layer 3, and a gap is reserved as a voltage monitoring point on the semiconductor layer 4, so as to monitor the voltage.

Specifically, in the present embodiment, detection on whether an insulation failure occurs may also be implemented by using the voltage monitoring point on the semiconductor layer 4. If an earthed voltage is present at the voltage monitoring point, it indicates an insulation failure occurs, and otherwise, no insulation failure occurs. In this way, the accuracy of the insulation failure can be further verified.

Figure 2:
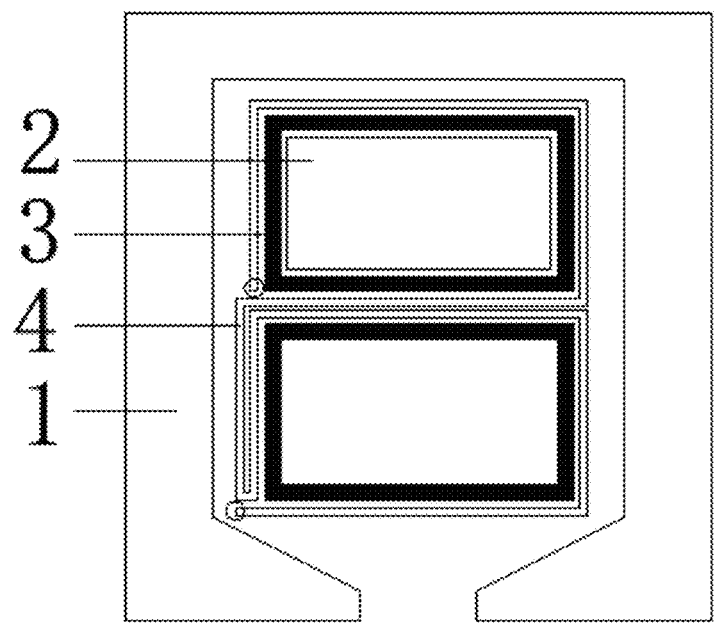
FIG. 2 is a structural schematic diagram illustrating a stator slot of an aircraft generator according to the present disclosure.
Figure 3:
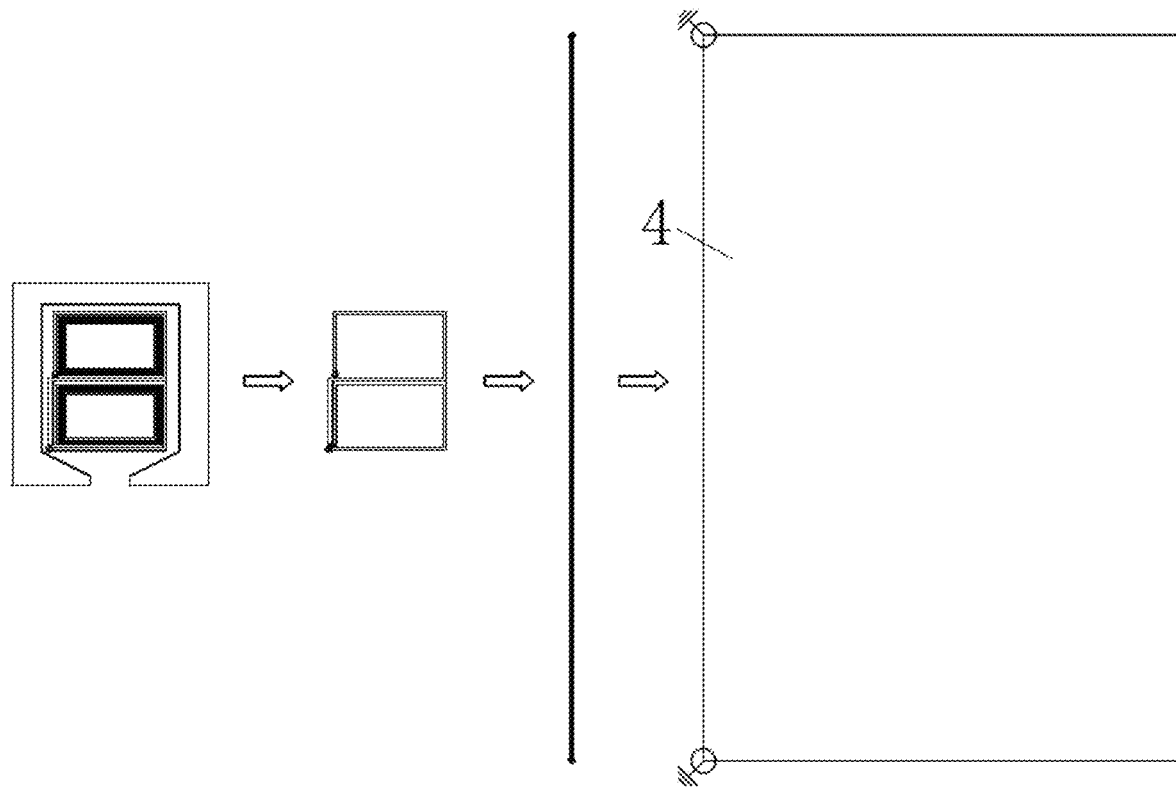
FIG. 3 is an axial unfolding diagram illustrating a semiconductor layer according to the present disclosure.
Figure 4:
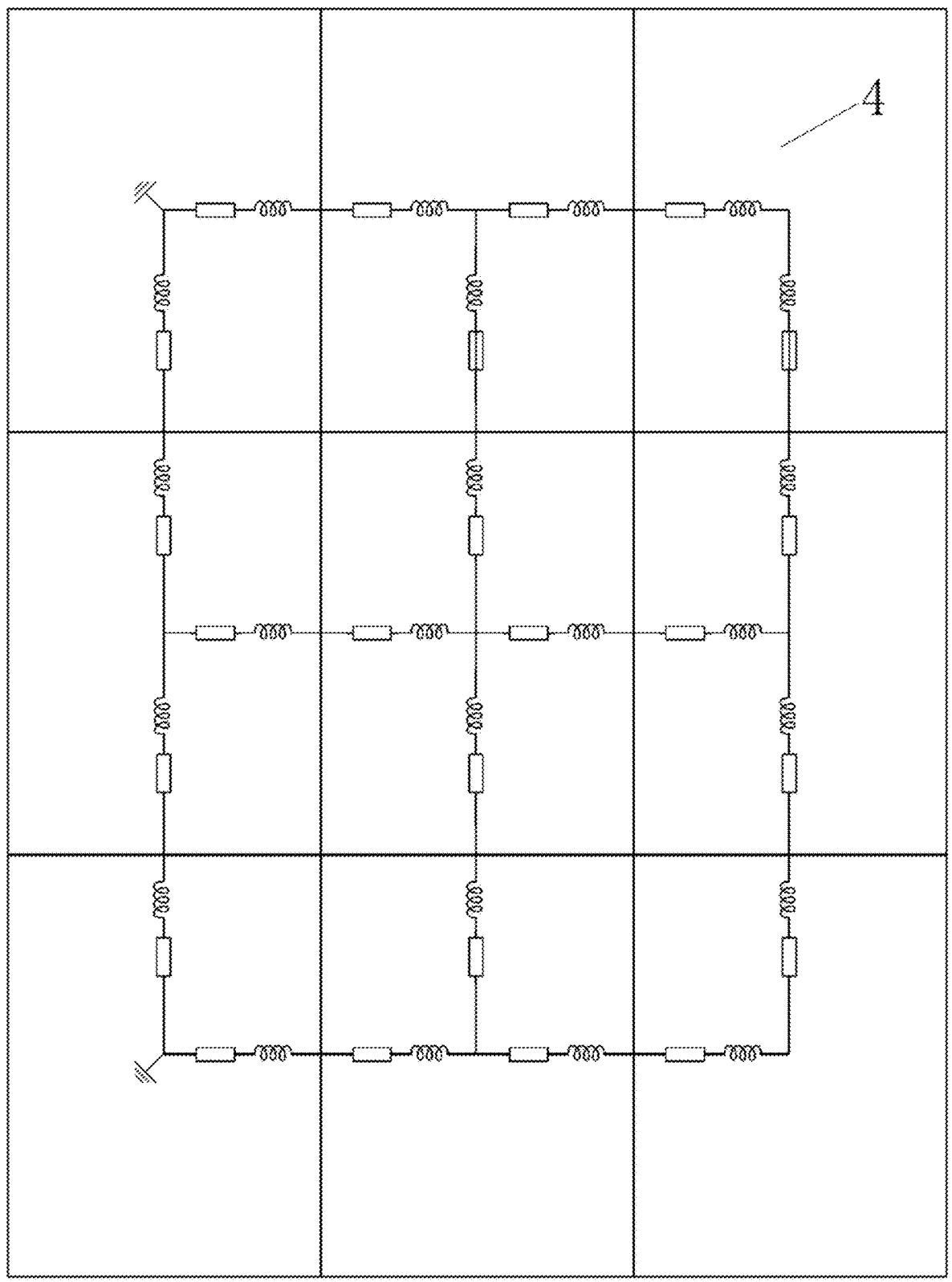
FIG. 4 is a schematic diagram illustrating a position of an insulation failure detection circuit according to the present disclosure.

Preferably, the voltage monitoring point may be located at the positions circled in the FIGS. 2 and 3.

In a preferred embodiment of the present disclosure, before the step S4 is performed, the method further comprises:
  determining whether a voltage is present at the voltage monitoring point;
  if yes, outputting the detection result indicating presence of the insulation failure and performing the step S4;
  if not, returning to perform the step S3 of supplying power to the three-phase winding.

Specifically, in the present embodiment, the determination of the voltage monitoring point for the voltage is taken as an advance determination of the step S4. When a voltage is present at the voltage monitoring point, the insulation failure is positioned in step S4. When no voltage is present at the voltage monitoring point, it indicates no input voltage is in the insulation failure detection circuit. Thus, the operation of continuing power supply is directly performed so as to save the step flow and increase the analysis rate.

Preferably, Taking a phase-A winding as an example, an insulation failure position is at the position A', and a wire at the position A' is short-circuited with the semiconductor layer 4 at the corresponding position, and hence, the potential at the position of occurrence of a fault in the semiconductor layer 4 is changed to UA'. At this time, the potential of the insulation failure position is UA', and the potential at the voltage monitoring point is 0. A potential difference is generated in the semiconductor layer 4, and therefore, a voltage is generated at the voltage monitoring point.

Preferably, when the insulation failure position is different, the position and amplitude of the potential in the semiconductor layer 4 are different, and the voltage at the voltage monitoring point is also different. Therefore, by identifying a voltage signal, the insulation failure can be accurately positioned.

In a preferred embodiment of the present disclosure, in step S2, the semiconductor layer 4 is partitioned into a plurality of zones and semiconductor electric parameters of each zone are equivalently set to inductances and resistors. Based on position of each zone, the inductances and resistors equivalently set are connected head to tail sequentially, so as to form a resistor-inductance branch network corresponding to the semiconductor layer 4.

Figure 5:
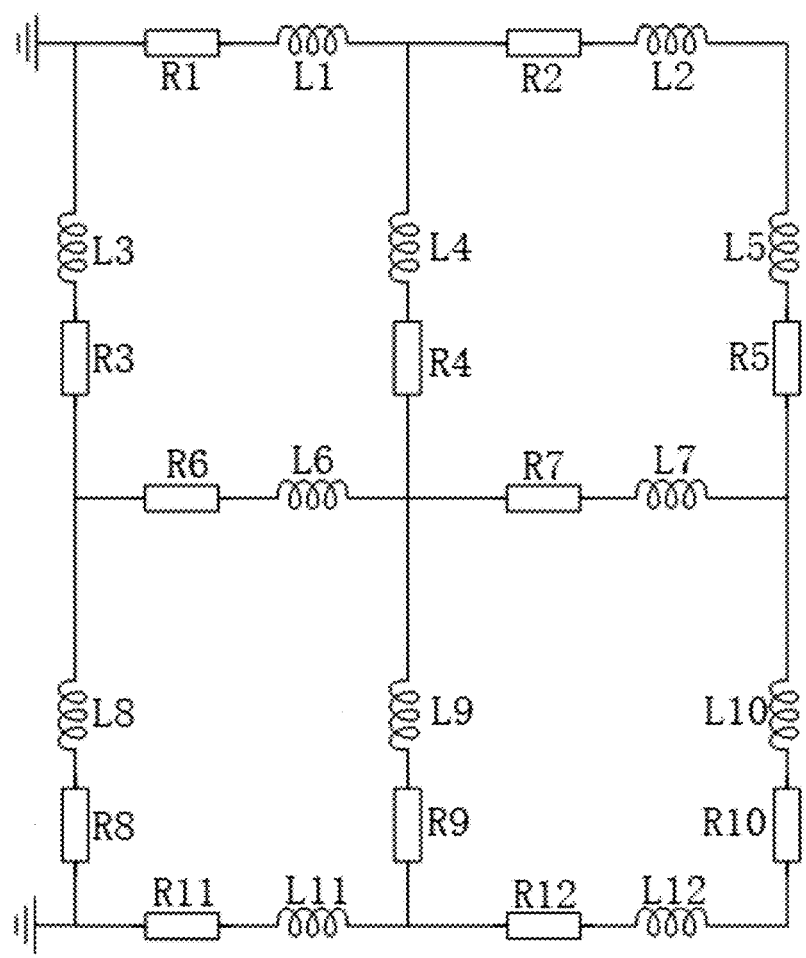
FIG. 5 is a circuit diagram illustrating an insulation failure detection circuit according to the present disclosure.

In a preferred embodiment of the present disclosure, as shown in FIG. 5, the insulation failure detection circuit comprises:
  a first resistor R1, where one end of the first resistor R1 is earthed;
  a first inductance L1, where one end of the first inductance L1 is connected to the other end of the first resistor R1;
  a second resistor R2, where one end of the second resistor R2 is connected to the other end of the first inductance L1;
  a second inductance L2, where one end of the second inductance L2 is connected to the other end of the second resistor R2;
  a third inductance L3, where one end of the third inductance L3 is connected to one end of the first resistor R1;
  a third resistor R3, where one end of the third resistor R3 is connected to the other end of the third inductance L3;
  a fourth inductance L4, where one end of the fourth inductance L4 is respectively connected to the other end of the first inductance L1 and one end of the second resistor R2;
  a fourth resistor R4, where one end of the fourth resistor R4 is connected to the other end of the fourth inductance L4;

a fifth inductance L5, where one end of the fifth inductance L5 is connected to the other end of the second inductance L2;
a fifth resistor R5, where one end of the fifth resistor R5 is connected to the other end of the fifth inductance L5;
a sixth resistor R6, where one end of the sixth resistor R6 is connected to the other end of the third resistor R3;
a sixth inductance L6, where one end of the sixth inductance L6 is connected to the other end of the sixth resistor R6, and the other end of the sixth inductance L6 is connected to the other end of the fourth resistor R4;
a seventh resistor R7, where one end of the seventh resistor R7 is respectively connected to the other end of the sixth inductance L6 and the other end of the fourth resistor R4;
a seventh inductance L7, where one end of the seventh inductance L7 is connected to the other end of the seventh resistor R7, and the other end of the seventh inductance L7 is connected to the other end of the fifth resistor R5;
an eighth inductance L8, where one end of the eighth inductance L8 is respectively connected to the other end of the third resistor R3 and one end of the sixth resistor R6;
an eighth resistor R8, where one end of the eighth resistor R8 is connected to the other end of the eighth inductance L8 and the other end of the eighth resistor R8 is earthed;
a ninth inductance L9, where one end of the ninth inductance L9 is respectively connected to the other end of the sixth inductance L6 and one end of the seventh resistor R7;
a ninth resistor R9, where one end of the ninth resistor R9 is connected to the other end of the ninth inductance L9;
a tenth inductance L10, where one end of the tenth inductance L10 is respectively connected to the other end of the seventh inductance L7 and the other end of the fifth resistor R5;
a tenth resistor R10, where one end of the tenth resistor R10 is connected to the other end of the tenth inductance L10;
an eleventh resistor R11, where one end of the eleventh resistor R11 is connected to the other end of the eighth resistor R8;
an eleventh inductance L11, where one end of the eleventh inductance L11 is connected to the other end of the eleventh resistor R11 and the other end of the eleventh inductance L11 is connected to the other end of the ninth resistor R9;
a twelfth resistor R12, where one end of the twelfth resistor R12 is respectively connected to the other end of the eleventh inductance L11 and the other end of the ninth resistor R9;
a twelfth inductance L12, where one end of the twelfth inductance L12 is connected to the other end of the twelfth resistor R12 and the other end of the twelfth inductance L12 is connected to the other end of the tenth resistor R10.

Specifically, in the present embodiment, the inductances and resistors on the insulation failure detection circuit are arranged in a rotational symmetry on the semiconductor layer 4 to partition the semiconductor layer 4 into the zones of equal size for arrangement of the resistor-inductance branch networks.

Preferably, the specifications of the inductances and resistors are not limited.

Figure 6:
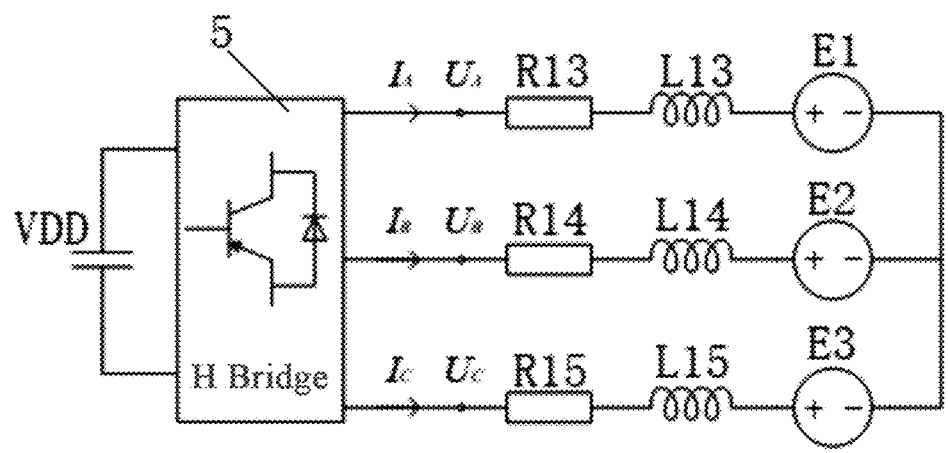
FIG. 6 is a circuit diagram illustrating a power supply circuit of an aircraft generator according to the present disclosure.

In a preferred embodiment of the present disclosure, as shown in FIG. 6, the power supply circuit comprises:
a H bridge control unit 5, where an input end of the H bridge control unit 5 is connected to an external power source VDD;
a thirteenth resistor R13, where one end of the thirteenth resistor R13 is connected to an output end of the H bridge control unit 5;
a thirteenth inductance L13, where one end of the thirteenth inductance L13 is connected to the other end of the thirteenth resistor R13 and the other end of the thirteenth inductance L13 is connected to a first winding E1 of the aircraft generator;
a fourteenth resistor R14, where one end of the fourteenth resistor R14 is connected to the output end of the H bridge control unit 5;
a fourteenth inductance L14, where one end of the fourteenth inductance L14 is connected to the other end of the fourteenth resistor R14, and the other end of the fourteenth inductance L14 is connected to a second winding R2 of the aircraft generator;
a fifteenth resistor R15, where one end of the fifteenth resistor R15 is connected to the output end of the H bridge control unit 5;
a fifteenth inductance L15, where one end of the fifteenth inductance L15 is connected to the other end of the fifteenth resistor R15, and the other end of the fifteenth inductance L15 is connected to a third winding E3 of the aircraft generator.

Specifically, in the present embodiment, when the aircraft generator works normally, the insulation failure detection circuit is not connected with the power supply circuit. When an insulation failure occurs, the input voltage of the power supply circuit will surge from the insulation layer 3 into the insulation failure detection circuit on the semiconductor layer 4, so as to form an electrical connection.

In a preferred embodiment of the present disclosure, in step S4, point voltages at four opposite angles of equi-potential lines of the fault point are respectively detected. Corresponding voltage drop ratios obtained by processing four point voltages in pairs, and then each voltage drop ratio is compared with a preset fault point ratio table to obtain the corresponding insulation failure position.

Specifically, in the present embodiment, considering, for each insulation failure position, three voltage drop ratios calculated based on the point voltages of four opposite angles of the equi-potential lines of the fault point are unique and different, the specific insulation failure position can be accurately obtained by simply comparing the voltage drop ratios and the fault point ratios.

Although the present disclosure is made as above, the scope of protection of the present disclosure is not limited hereto. Various changes and modifications made by those skilled in the art without departing from the spirit and scope of the present disclosure shall all fall within the scope of protection of the present disclosure.

The invention claimed is:
1. A method of detecting and positioning an insulation failure of an aircraft generator, wherein the method comprises:
step S1, for each stator slot (1) in the aircraft generator, wrapping one semiconductor layer (4) on a surface of an external insulation layer (3) of each copper conductor (2) in the stator slot (1);
step S2, for each semiconductor layer (4), partitioning the semiconductor layer (4) to obtain a plurality of zones, disposing a resistor-inductance branch network in each zone, and connecting the resistor-inductance branch networks to form an insulation failure detection circuit;

step S3, supplying power to a three-phase winding of the aircraft generator from an external power source;

step S4, determining whether an unearthed voltage is present in four end corners of the insulation failure detection circuit;

if not, returning to perform the step S3 of supplying power to the three-phase winding;

if yes, outputting a detection result indicating an insulation failure and collecting an insulation failure position with potential change and a potential difference in the insulation failure detection circuit as a positioning result for outputting.

2. The method of detecting and positioning an insulation failure of an aircraft generator of claim 1, wherein in step S1, the semiconductor layer (4) unfolded to form a square shape is wrapped on the surface of the insulation layer (3), and a gap is reserved as a voltage monitoring point on the semiconductor layer (4) to monitor the voltage.

3. The method of detecting and positioning an insulation failure of an aircraft generator of claim 2, wherein before the step S4 is performed, the method further comprises:

determining whether a voltage is present at the voltage monitoring point;

if yes, outputting the detection result indicating presence of the insulation failure and performing the step S4;

if not, returning to perform the step S3 of supplying power to the three-phase winding.

4. The method of detecting and positioning an insulation failure of an aircraft generator of claim 1, wherein in step S2, the semiconductor layer (4) is partitioned into a plurality of zones and semiconductor electric parameters of each zone are equivalently set to inductances and resistors; and wherein based on position of each zone, the inductances and resistors equivalently set are connected head to tail sequentially, so as to form the resistor-inductance branch network corresponding to the semiconductor layer (4).

5. The method of detecting and positioning an insulation failure of an aircraft generator of claim 1, wherein the insulation failure detection circuit comprises:

a first resistor, where one end of the first resistor is earthed;

a first inductance, where one end of the first inductance is connected to the other end of the first resistor;

a second resistor, where one end of the second resistor is connected to the other end of the first inductance;

a second inductance, where one end of the second inductance is connected to the other end of the second resistor;

a third inductance, where one end of the third inductance is connected to one end of the first resistor;

a third resistor, where one end of the third resistor is connected to the other end of the third inductance;

a fourth inductance, where one end of the fourth inductance is respectively connected to the other end of the first inductance and one end of the second resistor;

a fourth resistor, where one end of the fourth resistor is connected to the other end of the fourth inductance;

a fifth inductance, where one end of the fifth inductance is connected to the other end of the second inductance;

a fifth resistor, where one end of the fifth resistor is connected to the other end of the fifth inductance;

a sixth resistor, where one end of the sixth resistor is connected to the other end of the third resistor;

a sixth inductance, where one end of the sixth inductance is connected to the other end of the sixth resistor, and the other end of the sixth inductance is connected to the other end of the fourth resistor;

a seventh resistor, where one end of the seventh resistor is respectively connected to the other end of the sixth inductance and the other end of the fourth resistor;

a seventh inductance, where one end of the seventh inductance is connected to the other end of the seventh resistor, and the other end of the seventh inductance is connected to the other end of the fifth resistor;

an eighth inductance, where one end of the eighth inductance is respectively connected to the other end of the third resistor and one end of the sixth resistor;

an eighth resistor, where one end of the eighth resistor is connected to the other end of the eighth inductance and the other end of the eighth resistor is earthed;

a ninth inductance, where one end of the ninth inductance is respectively connected to the other end of the sixth inductance and one end of the seventh resistor;

a ninth resistor, where one end of the ninth resistor is connected to the other end of the ninth inductance;

a tenth inductance, where one end of the tenth inductance is respectively connected to the other end of the seventh inductance and the other end of the fifth resistor;

a tenth resistor, where one end of the tenth resistor is connected to the other end of the tenth inductance;

an eleventh resistor, where one end of the eleventh resistor is connected to the other end of the eighth resistor;

an eleventh inductance, where one end of the eleventh inductance is connected to the other end of the eleventh resistor and the other end of the eleventh inductance is connected to the other end of the ninth resistor;

a twelfth resistor, where one end of the twelfth resistor is respectively connected to the other end of the eleventh inductance and the other end of the ninth resistor;

a twelfth inductance, where one end of the twelfth inductance is connected to the other end of the twelfth resistor and the other end of the twelfth inductance is connected to the other end of the tenth resistor.

6. The method of detecting and positioning an insulation failure of an aircraft generator of claim 1, wherein the power supply circuit comprises:

a H bridge control unit (5), where an input end of the H bridge control unit (5) is connected to an external power source;

a thirteenth resistor, where one end of the thirteenth resistor is connected to an output end of the H bridge control unit (5);

a thirteenth inductance, where one end of the thirteenth inductance is connected to the other end of the thirteenth resistor and the other end of the thirteenth inductance is connected to a first winding of the aircraft generator;

a fourteenth resistor, where one end of the fourteenth resistor is connected to the output end of the H bridge control unit (5);

a fourteenth inductance, where one end of the fourteenth inductance is connected to the other end of the fourteenth resistor, and the other end of the fourteenth inductance is connected to a second winding of the aircraft generator;

a fifteenth resistor, where one end of the fifteenth resistor is connected to the output end of the H bridge control unit (5);

a fifteenth inductance, where one end of the fifteenth inductance is connected to the other end of the fifteenth resistor, and the other end of the fifteenth inductance is connected to a third winding of the aircraft generator.

7. The method of detecting and positioning an insulation failure of an aircraft generator of claim 1, wherein in step S4, point voltages at four opposite angles of equi-potential lines of the fault point are respectively detected; and wherein corresponding voltage drop ratios obtained by processing four point voltages in pairs, and then each voltage drop ratio is compared with a preset fault point ratio table to obtain the corresponding insulation failure position.

\* \* \* \* \*